(12) United States Patent
Wang et al.

(10) Patent No.: US 11,696,003 B2
(45) Date of Patent: *Jul. 4, 2023

(54) MULTI-CAMERA ON A CHIP AND CAMERA MODULE DESIGN

(71) Applicant: Samsung Electronics Co., Ltd., Suwon-si (KR)

(72) Inventors: Yibing Michelle Wang, Temple City, CA (US); Radwanul Hasan Siddique, Pasadena, CA (US); Kwang Oh Kim, Cerritos, CA (US)

(73) Assignee: SAMSUNG ELECTRONICS CO., LTD.

( * ) Notice: Subject to any disclaimer, the term of this patent is extended or adjusted under 35 U.S.C. 154(b) by 0 days.

This patent is subject to a terminal disclaimer.

(21) Appl. No.: 17/527,155

(22) Filed: Nov. 15, 2021

(65) Prior Publication Data

US 2022/0078318 A1 Mar. 10, 2022

Related U.S. Application Data

(63) Continuation of application No. 16/945,787, filed on Jul. 31, 2020, now Pat. No. 11,201,993.

(Continued)

(51) Int. Cl.
*H04N 23/45* (2023.01)
*H04N 23/55* (2023.01)
*H04N 23/80* (2023.01)

(52) U.S. Cl.
CPC .............. *H04N 23/45* (2023.01); *H04N 23/55* (2023.01); *H04N 23/80* (2023.01)

(58) Field of Classification Search
CPC . H04N 5/2258; H04N 5/23229; H04N 5/2254
See application file for complete search history.

(56) References Cited

U.S. PATENT DOCUMENTS 10,823,615 B2 * 11/2020 Ooi ..................... G01J 3/2823
2007/0295893 A1 12/2007 Olsen et al.
(Continued)

FOREIGN PATENT DOCUMENTS

WO 2020007622 A1 1/2020

OTHER PUBLICATIONS

Chen, Bo Han, et al., "GaN Metalens for Pixel-Level Full-Color Routing at Visible Light," 2017 American Chemical Society, Nano Letters, 2017, pp. 6345-6352.
(Continued)

*Primary Examiner* — Nasim N Nirjhar
(74) *Attorney, Agent, or Firm* — Renaissance IP Law Group LLP (57) ABSTRACT

A camera system includes two or more sensor arrays and an optical path. The sensor arrays are on the same sensor chip. Each sensor array includes the same field of view (FOV) as each other sensor array. The optical path includes a main lens and a metalens that are shared by each sensor array, and a microlens associated with each sensor array. The metalens splits incident light into different spectrums of light and directs each respective spectrum to a corresponding sensor array. The different spectrums of light include at least two of visible light, near infrared light, shortwave infrared and longwave infrared, and at least one sensor array includes single-photon avalanche diodes. The image processor that provides image processing, object recognition and object tracking and/or image fusion functionality may be on the same sensor chip as the sensor arrays.

20 Claims, 6 Drawing Sheets

Related U.S. Application Data (60) Provisional application No. 63/039,449, filed on Jun. 15, 2020.

(56) References Cited

U.S. PATENT DOCUMENTS

| | | |
|---|---|---|
| 2010/0265333 A1 | 10/2010 | Gordon et al. |
| 2014/0132946 A1 | 5/2014 | Sebastian et al. |
| 2016/0037070 A1 | 2/2016 | Mandelli |
| 2019/0041660 A1* | 2/2019 | Ahmed .................. G06V 40/166 |
| 2019/0064532 A1 | 2/2019 | Riley, Jr. et al. |
| 2019/0139243 A1* | 5/2019 | You ...................... G02B 3/0081 |
| 2019/0195688 A1* | 6/2019 | Atabaki ..................... G01J 3/44 |
| 2019/0204610 A1 | 7/2019 | Sinkular et al. |
| 2019/0273850 A1* | 9/2019 | Fahringer .......... H04N 5/22541 |
| 2019/0383943 A1 | 12/2019 | Dunn et al. |
| 2020/0018684 A1 | 1/2020 | Vercruysse |
| 2020/0057151 A1* | 2/2020 | Finkelstein ........... G01S 7/4913 |
| 2020/0058697 A1 | 2/2020 | Meylan |
| 2020/0064195 A1* | 2/2020 | Gallinet .................. G02B 5/201 |
| 2020/0116558 A1 | 4/2020 | Pacala et al. |
| 2020/0235149 A1* | 7/2020 | Shiraishi .................. G02B 7/34 |
| 2020/0344426 A1* | 10/2020 | Petilli .................... G02B 30/10 |
| 2021/0118932 A1* | 4/2021 | Cho .................. H01L 27/14627 |
| 2021/0360154 A1* | 11/2021 | Slobodin ................ H04N 7/144 |

OTHER PUBLICATIONS

Corrected Notice of Allowabilty for U.S. Appl. No. 16/945,787, dated Nov. 10, 2021.

Li, Bo et al., "Metalens-Based Miniaturized Optical Systems," Micromachines 2019, 10, 310, 2019, 21 pages.

Notice of Allowance for U.S. Appl. No. 16/945,787, dated Aug. 3, 2021.

Office Action for U.S. Appl. No. 16/945,787, dated Mar. 23, 2021.

* cited by examiner

MULTI-CAMERA ON A CHIP AND CAMERA MODULE DESIGN

CROSS-REFERENCE TO RELATED APPLICATION

This application is a continuation of U.S. patent application Ser. No. 16/945,787, filed on Jul. 31, 2020, which claims the priority benefit under 35 U.S.C. § 119(e) of U.S. Provisional Patent Application Ser. No. 63/039,449, filed on Jun. 15, 2020, the disclosures of which are incorporated herein by reference in their entirety.

TECHNICAL FIELD

The subject matter disclosed herein relates to multi-camera systems. More particular, the subject matter disclosed herein relates to a multi-camera system that includes a single sensor chip.

BACKGROUND

Many imaging and sensing system use multiple cameras. Usually, the multiple cameras of a multi-camera system have different fields of view (FOV) and different functionalities. For example, a multi-camera system may include a two-dimensional (2D) wide-angle FOV, a 2D ultra-wide-angle FOV, a 2D telescopic view, and a 3D time-of-flight (TOF) functionality. Such a multi-camera system typically includes a high cost, a large size, a large data bandwidth, and a high operating-power consumption. Additionally, a large amount of data may be generated by all of the cameras in the multi-camera system, which may also consume a significant amount of input/output (IO) power to send the data to a central-processing chip for further processing. Alignment of the cameras adds complexity for a camera module manufacturing and assembly process. Moreover, camera alignment may be easily disturbed by vibration and physical distortion, and camera calibration may be required for fusing images from multiple cameras with different FOV, which further adds processing power and complexity. Also, real-time calibration may likely be required under highly vibrating condition.

SUMMARY

An example embodiment provides a camera system that may include two or more sensor arrays, and an optical path. The two or more sensor arrays may be on a same die in which each sensor array may include an array of pixels that sense light and in which each sensor array may include a same FOV as each other sensor array. The optical path may include a main lens, a metalens and two or more microlens arrays. The main lens and the metalens may be shared by each sensor array and each microlens array may be associated with a corresponding sensor array. The metalens may split light incident on the metalens into different spectrums of light and direct each respective spectrum to a corresponding sensor array. In one embodiment, the different spectrums of light may include at least two of visible light, near infrared light, shortwave infrared and longwave infrared. In another embodiment, at least one sensor array may include a single-photon avalanche diode. In yet another embodiment, the metalens may include at least one layer of nanostructures formed on a substrate in which the at least one layer of nanostructures may diffract and/or focus at least one spectrum of the light incident on the metalens to the corresponding sensor array.

An example embodiment provides a camera system that may include two or more sensor arrays, an optical path and an image processor. The two or more sensor arrays may be on a same die in which each sensor array may include an array of pixels that sense light and in which each sensor array may include a same FOV as each other sensor array. The optical path may include a main lens, a metalens and two or more microlens arrays. The main lens and the metalens may be shared by each sensor array and each microlens array may be associated with a corresponding sensor array. The metalens may split light incident on the metalens into different spectrums of light and direct each respective spectrum to a corresponding sensor array. The image processor may be on the same die as the sensor arrays. The image processor may provide at least one of image processing, object recognition and object tracking of at least one output from the two or more sensor arrays and image fusion of outputs from two or more sensor array. In one embodiment, the metalens may include at least one layer of nanostructures formed on a substrate in which the at least one layer of nanostructures may diffract and/or focus at least one spectrum of the light incident on the metalens to the corresponding sensor array. Nanostructures of the at least one layer of nanostructures may include a material having a refractive index greater than 1.9. The substrate may include one of a planar surface and a curved surface.

An example embodiment provides a camera system that may include two or more sensor arrays and an optical path. The two or more sensor arrays may be on a same die. Each sensor array may include an array of pixels that sense light. Each sensor array may include a same FOV as each other sensor array, and at least one sensor array may include a single-photon avalanche diode. The optical path may include a main lens, a metalens and two or more microlens arrays. The main lens and the metalens may be shared by each sensor array and each microlens array may be associated with a corresponding sensor array. The metalens may split light incident on the metalens into different spectrums of light and direct each respective spectrum to a corresponding sensor array. In one embodiment, the different spectrums of light may include at least two of visible light, near infrared light, shortwave infrared and longwave infrared. In another embodiment, the metalens may include at least one layer of nanostructures formed on a substrate in which the at least one layer of nanostructures may diffract and/or focus at least one spectrum of the light incident on the metalens to the corresponding sensor array. Nanostructures of the at least one layer of nanostructures may include a material having a refractive index greater than 1.9, and the substrate may include one of a planar surface and a curved surface.

BRIEF DESCRIPTION OF THE DRAWING

In the following section, the aspects of the subject matter disclosed herein will be described with reference to exemplary embodiments illustrated in the figure, in which.

DETAILED DESCRIPTION

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail not to obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not be necessarily all referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. Similarly, various waveforms and timing diagrams are shown for illustrative purpose only. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-chip (SoC), an assembly, and so forth.

The subject matter disclosed herein provides multiple cameras that may be integrated on the same sensor chip and that may cover different spectrums. Each of the cameras on the sensor chip has the same FOV, which avoids alignment and calibration issues that may be associated with traditional multi-camera systems. No interleaving of different pixel arrays into one hybrid array is needed because perfect alignment is provided for the different cameras. Image processing and fusion functionality may be implemented on the sensor chip, which may save power and may reduce latency.

In one embodiment, an optical stack of the multi-camera system disclosed herein includes a main lens (one single lens or a set of lens), a metalens and microlens. Each camera on the sensor chip may include an image sensor having an array of pixels. The different pixel arrays on the same sensor chip may be provided with different readout paths so that each pixel array and its corresponding readout circuit may form an individual image sensor.

The different image sensors of the multi-camera system may include, but are not limited to, Red, Green, Blue and Near Infrared (RGB+NIR) image sensors, RGB and Single Photon Avalanche Diode (RGB+SPAD) image sensors, 2D and short wavelength IR (2D+SWIR) image sensors, and/or hyperspectral image sensors. Light that passes through the main lens may be split by the metalens and redirected to corresponding image sensors on the chip. Each image sensor has the same FOV.

In one embodiment, the metalens may be integrated with a main lens assembly or module. In another embodiment, the metalens may be formed as a cover for the sensor chip. In still another embodiment, the metalens may be formed as a separate piece. The metalens may be fabricated on a flat or curved surface that may be formed from glass or another transparent material, such as plastic or any low index organic/inorganic materials that are optically transparent in visible-NIR (400 nm-1000 nm). The metalens may include a single layer of nanostructures or multiple layers of nanostructures.

Figure 1:
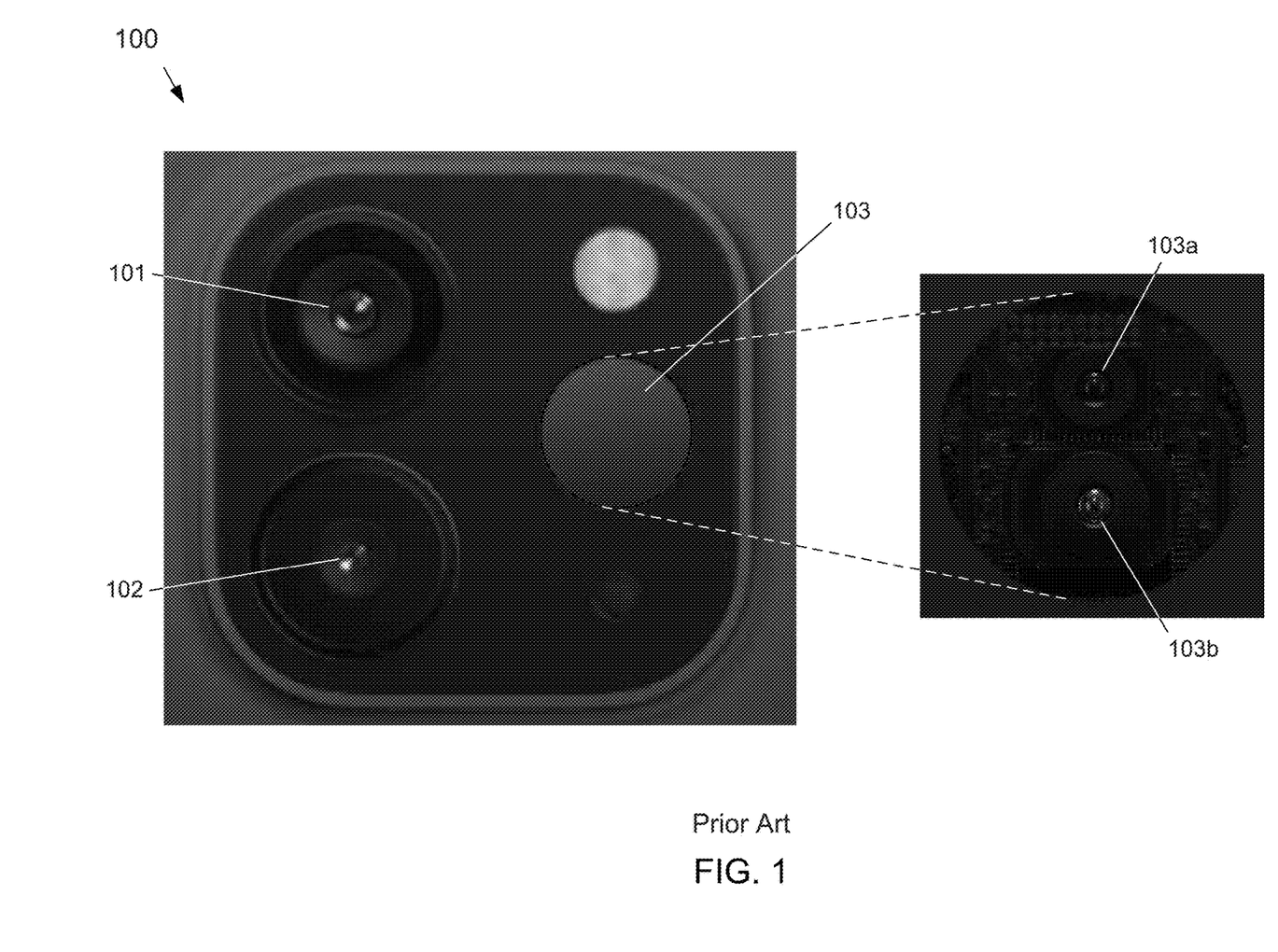
FIG. 1 depicts a traditional arrangement of main lenses for an example of a traditional multi-camera system that includes two 2D cameras and one LiDAR camera.

FIG. 1 depicts a traditional arrangement 100 of main lenses for an example of a traditional multi-camera system that includes two 2D cameras 101 and 102, and one LiDAR camera 103. The LiDAR camera 103 includes a lens 103a for a vertical cavity surface emitting laser (VCSEL) array and a lens 103b for a SPAD-based LiDAR sensor. Each camera has a different FOV, and a separate main lens. Additionally, calibration is needed for each camera for image fusion.

Figure 2A:
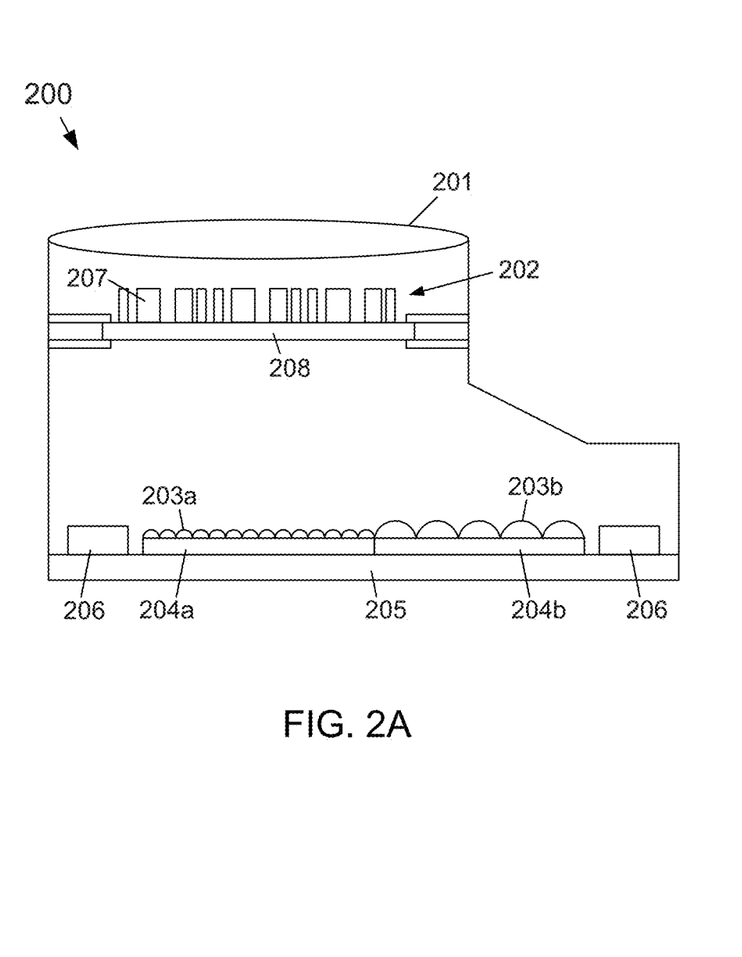
FIG. 2A depicts an example optical stack for a multi-camera system according to the subject matter disclosed herein.

FIG. 2A depicts an example optical stack 200 for a multi-camera system according to the subject matter disclosed herein. The optical stack 200 may include a main lens 201, a metalens (or metaoptics) 202, and a microlens array 203 that may be associated with and formed on each (pixel) array 204. As depicted in FIG. 2A, two microlenses 203a and 203b respectively are associated with and formed on pixel arrays 204a and 204b, and the two pixel arrays 204a and 204b are formed on a single sensor chip 205. In one embodiment, the pixel arrays 204 may be individual 2D and 3D sensors. In another embodiment, the pixel arrays 204 may be hybrid 2D and 3D sensors. Peripheral components 206 that support the pixel arrays may also be formed on the single sensor chip 205.

The main lens 201 may include a single lens or a set of lenses. The metalens 202 may include one or more layers of nanostructures 207 formed on a substrate 208, such as glass or another transparent substrate, such as plastic or any low index organic/inorganic materials that are optically transparent in visible-NIR (400 nm-1000 nm). The nanostructures 207 may be referred to herein as scatterers and/or nanoantennas. The substrate 208 for the metalens 202 may be flat or curved, and may be formed as, for example, a cover for the sensor chip 205, may be formed as part of a main lens assembly 201, or, as depicted in FIG. 2A, as a separate piece.

Figure 2B:
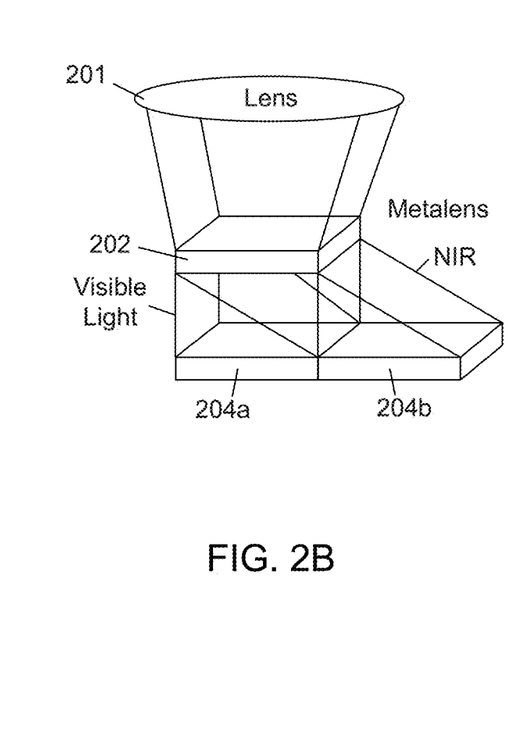
FIG. 2B depicts an example embodiment of metalens separating visible light and NIR light by focusing visible light onto an RGB pixel array and NIR onto a SPAD/APD pixel array according to the subject matter disclosed herein.

FIG. 2B depicts an example embodiment of metalens 202 separating visible light and NIR light by focusing visible light onto an RGB pixel array 204a and NIR onto a SPAD/APD pixel array 204b according to the subject matter disclosed herein.

Figure 3:
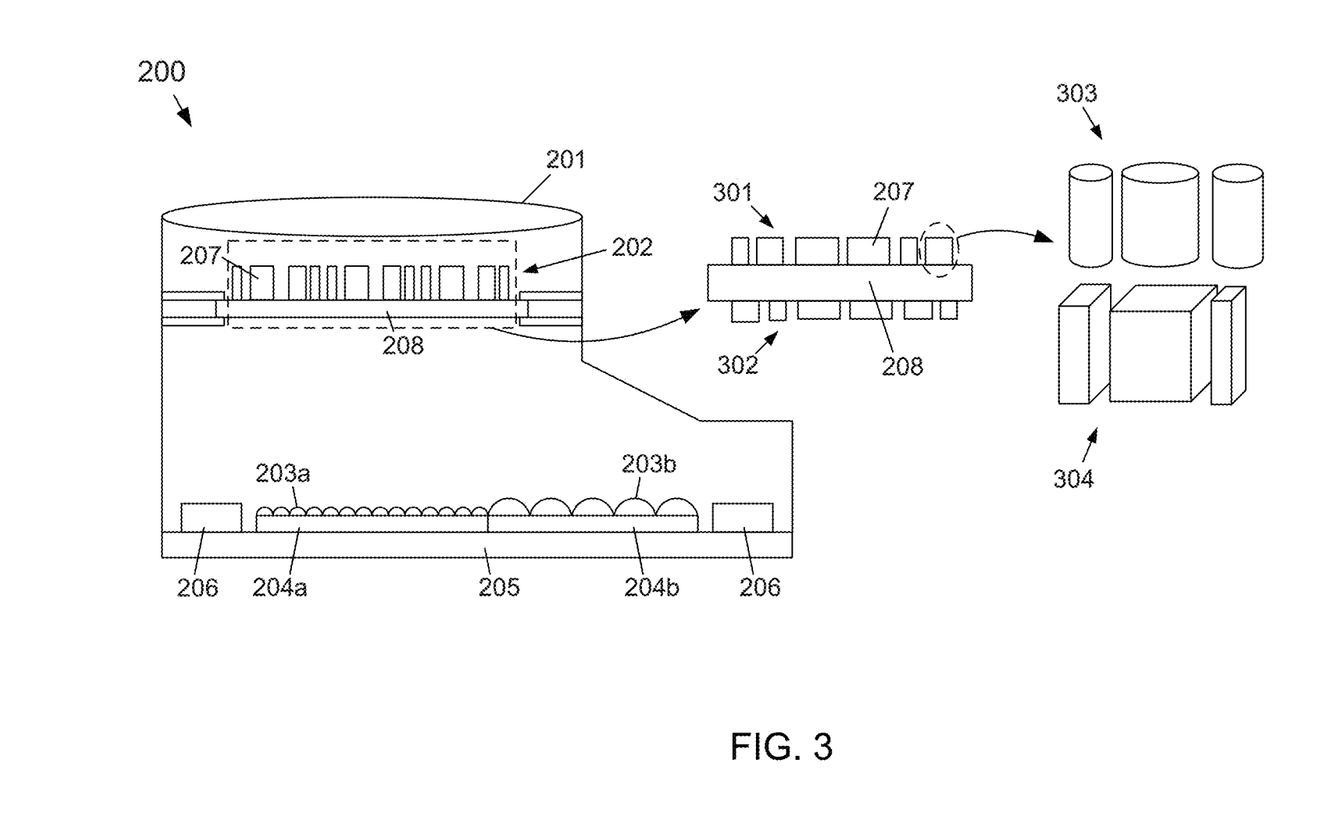
FIG. 3 depicts a metalens that may include an arrangement of nanostructures that may diffract and focus visible light (400 nm-700 nm) to an RGB pixel array according to the subject matter disclosed herein.

FIG. 3 depicts the metalens 202 as including an arrangement of nanostructures 205 that may diffract and focus visible light (400 nm-700 nm) to an RGB pixel array 204a. The metalens 202 may also focus and/or diffract a broad or narrow band NIR light (700 nm-900 nm) to a SPAD/APD pixel array 204b. The metalens 202 may include a single layer 301 of nanostructures 207 formed on a surface of the substrate 208. Alternatively, the metalens 202 may include multiple layers 301 and 302 of nanostructures 207 that may be formed on opposite surfaces of the substrate 208. The nanostructures 207 may be formed from $TiO_2$, $Si_3N_4$ or any other high refractive-index (>1.9 at the desired wavelength) semiconductor or oxides that are transparent in both the visible and the NIR spectrum (400 nm-1000 nm), and may be formed to have cylindrical shapes 303 and/or cuboid shapes 304 of various sizes.

Figure 4A:
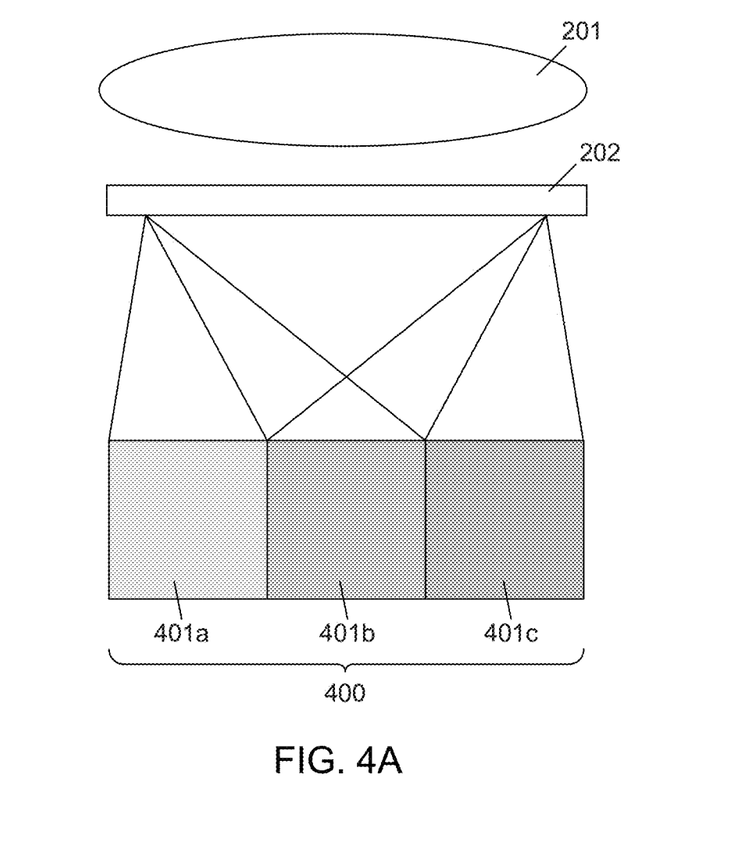
FIG. 4A depicts an example embodiment configuration of an RGB sensor having separate R/G/B subarrays, and that a metalens that may diffract and/or focus the different spectrums of light onto the subarrays according to the subject matter disclosed herein.
Figure 4B:
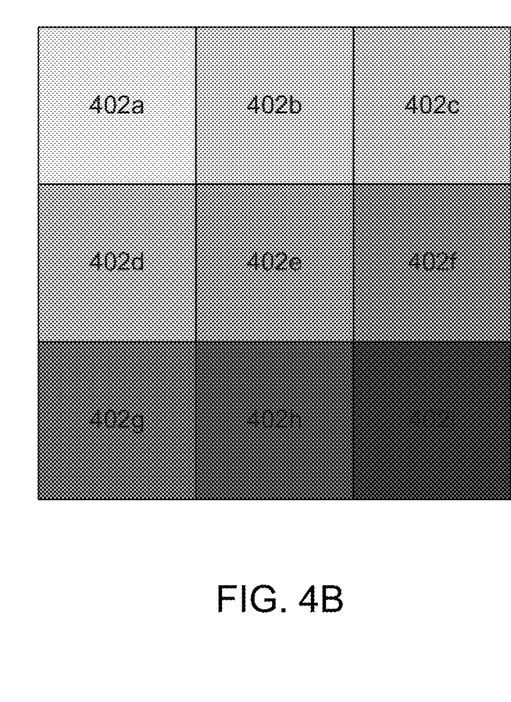
FIG. 4B depicts a plan view of an example embodiment of multiple pixel arrays that may each sense different bands of light (i.e., R, G, B, NIR, shortwave infrared (SWIR), longwave infrared (LWIR), etc.) according to the subject matter disclosed herein.

FIG. 4A depicts an example embodiment configuration of an RGB sensor 400 having separate R/G/B subarrays 401a-401c, and that the metalens 202 may diffract and/or focus the different spectrums of light onto the subarrays 401a-401c. FIG. 4B depicts a plan view of an example embodiment of multiple pixel arrays 402a-402i that may each sense different bands of light (i.e., R, G, B, NIR, shortwave infrared (SWIR), longwave infrared (LWIR), etc.). The different shades of gray for the pixel arrays 402a-402i may represent different spectrums or bands of light for which the pixel array is configured to sense. One or more of the pixel arrays 402a-402i may be a SPAD sensor that may be used for time-of-flight (ToF) measurements. For this example embodiment, the metalens (not shown in FIG. 4B) would separate and direct each different band of light to the corresponding pixel array.

Figure 5:
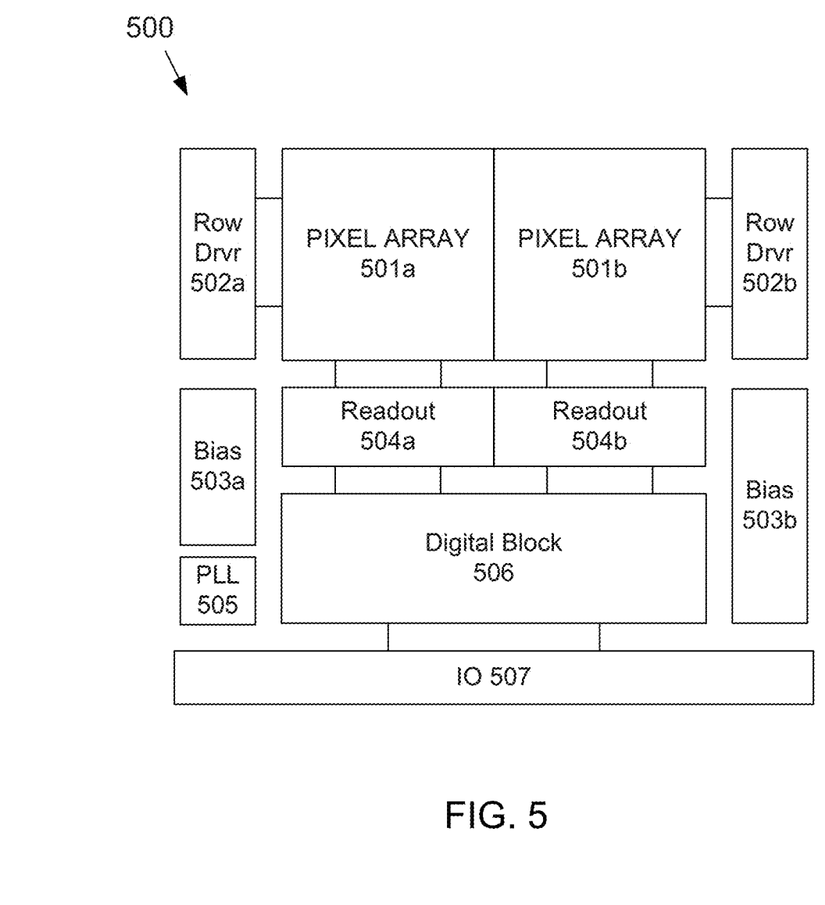
FIG. 5 depicts an example embodiment of an on-chip multi-camera architecture (single-chip multi-camera sensor) according to the subject matter disclosed herein.

FIG. 5 depicts an example embodiment of an on-chip multi-camera architecture (single-chip multi-camera sensor) 500 according to the subject matter disclosed herein. The single-chip multi-camera sensor 500 may include multiple pixel arrays on the same die in which each pixel array may be an individual camera and in which each camera may have the same FOV. Each camera may have an optical path having a main lens (single or a set of lens), a metalens (single or multiple layers) and microlens (see FIG. 2). The main lens and the metalens may be shared by all cameras. The metalens may split the incoming light from the main lens and redirect different spectrums of light onto corresponding pixel arrays. Image processing and fusion functions may be completed on chip without going through IOs so that system power may be reduced and processing latency may also be reduced.

The single-chip multi-camera sensor 500 may include pixel arrays 501*a* and 501*b*, row drivers (row drvrs) 502*a* and 502*b*, bias circuitry 503*a* and 503*b*, readout circuitry 504*a* and 504*b*, a phase-locked loop (PLL) circuitry 505, a digital block 506, and IO circuitry 507.

The pixel array 501*a* is driven in a well-known manner by the row driver 502*a*. The bias circuitry 503*a* provides bias voltages and currents to the pixel array 501*a* and the row driver 502*a*. Similarly, the pixel array 501*b* is driven in a well-known manner by the row driver 502*b*, and the bias circuitry 503*b* provides bias voltages and currents to the pixel array 501*b* and the row driver 502*b*. The PLL circuitry 505 provides synchronization and control signals to the various circuits of the architecture 500. The readout circuits 504*a* and 504*b* respectively coupled signals output from the pixel arrays 501*a* and 501*b* to the digital block 506.

The digital block 506 provides on-chip image processing, image fusion, object recognition and/or object tracking functionality without calibration because each camera of the multi-camera system 500 has the same FOV. Additionally, data from the multiple cameras (i.e., pixel arrays 501*a* and 501*b*) do not have to be transmitted outside of the chip because the architecture 500 includes on-hip fusion and processing, which saves IO power and reduces latency.

Although two pixels arrays 501*a* and 501*b* are depicted in FIG. 5, it should understood that in another embodiment, more than two pixel arrays may be included in the on-chip multi-camera architecture 500, in which case additional row drivers 502, bias circuitry 503 and readout circuitry 504 would also be included. It should also be understood that the single die on which the multiple pixel arrays are formed is not shown in FIG. 5.

Figure 6:
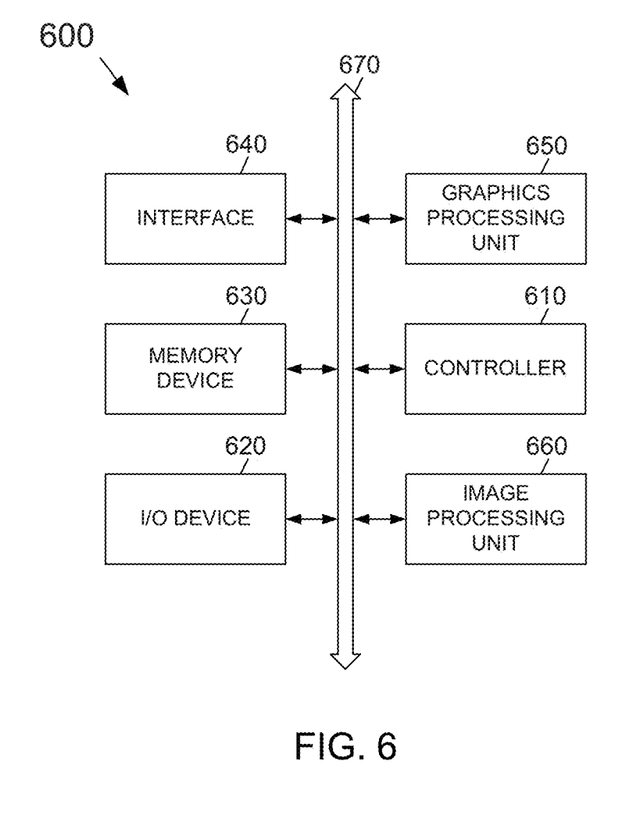
FIG. 6 depicts an electronic device that includes a multi-camera system that includes a single sensor chip according to the subject matter disclosed herein.

FIG. 6 depicts an electronic device 600 that includes a multi-camera system that includes a single sensor chip according to the subject matter disclosed herein. Electronic device 600 may be used in, but not limited to, a computing device, a personal digital assistant (PDA), a laptop computer, a mobile computer, a web tablet, a wireless phone, a cell phone, a smart phone, a digital music player, or a wireline or wireless electronic device. The electronic device 600 may also be part of, but not limited to, an ADAS, a mobile-device imaging system, an industrial imaging system, robotics, etc. The electronic device 600 may include a controller 610, an input/output device 620 such as, but not limited to, a keypad, a keyboard, a display, a touch-screen display, a camera, and/or an image sensor, a memory 630, an interface 640, a GPU 650, and an imaging processing unit 660 that are coupled to each other through a bus 670. The controller 610 may include, for example, at least one microprocessor, at least one digital signal processor, at least one microcontroller, or the like. The memory 630 may be configured to store a command code to be used by the controller 610 or a user data.

Electronic device 600 and the various system components of electronic device 600 may include the image processing unit 660. In one embodiment, the image processing unit may be part of a multi-camera system that includes a single sensor chip according to the subject matter disclosed herein. The interface 640 may be configured to include a wireless interface that is configured to transmit data to or receive data from a wireless communication network using a RF signal. The wireless interface 640 may include, for example, an antenna, a wireless transceiver and so on. The electronic system 600 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of, data-processing apparatus. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A camera system, comprising:
   two or more sensor arrays on a same die, each sensor array comprising an array of pixels that sense light and each sensor array comprising a same field of view (FOV) as each other sensor array; and
   an optical path comprising a metalens, the metalens comprising at least one layer of nanostructures formed on a substrate, the at least one layer of nanostructures diffracting and/or focusing at least one spectrum of light incident on the metalens to a corresponding sensor array, the metalens being shared by each sensor array, and the metalens splitting light incident on the metalens into different spectrums of light and directing each respective spectrum to a corresponding sensor array.

2. The camera system of claim 1, wherein the different spectrums of light comprises at least two of visible light, near infrared light, shortwave infrared and longwave infrared.

3. The camera system of claim 2, wherein at least one sensor array includes a single-photon avalanche diode.

4. The camera system of claim 1, wherein the optical path further comprises an optical path comprising a main lens and two or more microlens arrays, the main lens being shared by each sensor array and each microlens array being associated with a corresponding sensor array.

5. The camera system of claim 4, further comprising an image processor on the same die as the sensor arrays, the image processor providing at least one of image processing, object recognition and object tracking of at least one output from the two or more sensor arrays and image fusion of outputs from two or more sensor array.

6. The camera system of claim 1, wherein nanostructures of the at least one layer of nanostructures comprise a material having a refractive index greater than 1.9.

7. The camera system of claim 1, wherein the at least one layer of nanostructures is formed on a first surface of the substrate.

8. The camera system of claim 7, wherein a second layer of nanostructures is formed on a second surface of the substrate that is opposite the first surface of the substrate.

9. The camera system of claim 1, wherein the substrate comprises one of a planar surface and a curved surface.

10. The camera system of claim 1, wherein the camera system is part of a smartphone.

11. A camera system, comprising:
    two or more sensor arrays on a same die, each sensor array comprising an array of pixels that sense light and each sensor array comprising a same field of view (FOV) as each other sensor array;
    an optical path comprising a metalens, the metalens comprising at least one layer of nanostructures formed on a substrate, the at least one layer of nanostructures diffracting and/or focusing at least one spectrum of light incident on the metalens to a corresponding sensor array, the metalens being shared by each sensor array, and the metalens splitting light incident on the metalens into different spectrums of light and directing each respective spectrum to a corresponding sensor array; and
    an image processor on the same die as the sensor arrays, the image processor providing at least one of image processing, object recognition and object tracking of at least one output from the two or more sensor arrays and image fusion of outputs from two or more sensor array.

12. The camera system of claim 11, wherein the different spectrums of light comprises at least two of visible light, near infrared light, shortwave infrared and longwave infrared, and
    wherein at least one sensor array includes a single-photon avalanche diode.

13. The camera system of claim 11, wherein nanostructures of the at least one layer of nanostructures comprise a material having a refractive index greater than 1.9.

14. The camera system of claim 13, wherein the substrate comprises one of a planar surface and a curved surface.

15. The camera system of claim 11, wherein the at least one layer of nanostructures is formed on a first surface of the substrate.

16. The camera system of claim 15, wherein a second layer of nanostructures is formed on a second surface of the substrate that is opposite the first surface of the substrate.

17. A camera system, comprising:
    two or more sensor arrays on a same die, each sensor array comprising an array of pixels that sense light, each sensor array comprising a same field of view (FOV) as each other sensor array, and at least one sensor array includes a single-photon avalanche diode; and
    an optical path comprising a metalens, the metalens comprising at least one layer of nanostructures formed on a substrate, the at least one layer of nanostructures diffracting and/or focusing at least one spectrum of light incident on the metalens to a corresponding sensor array, the metalens being shared by each sensor array, and the metalens splitting light incident on the metalens into different spectrums of light and directing each respective spectrum to a corresponding sensor array.

18. The camera system of claim 17, wherein the different spectrums of light comprises at least two of visible light, near infrared light, shortwave infrared and longwave infrared.

19. The camera system of claim 18, wherein nanostructures of the at least one layer of nanostructures comprise a material having a refractive index greater than 1.9, and the substrate comprises one of a planar surface and a curved surface.

20. The camera system of claim 19, further comprising an image processor on the same die as the sensor arrays, the image processor providing at least one of image processing, object recognition and object tracking of at least one output from the two or more sensor arrays and image fusion of outputs from two or more sensor array.

\* \* \* \* \*